(12) United States Patent
Kronholz et al.

(10) Patent No.: US 8,728,896 B2
(45) Date of Patent: May 20, 2014

(54) EMBEDDED SIGMA-SHAPED SEMICONDUCTOR ALLOYS FORMED IN TRANSISTORS BY APPLYING A UNIFORM OXIDE LAYER PRIOR TO CAVITY ETCHING

(75) Inventors: Stephan Kronholz, Dresden (DE); Andreas Ott, Dresden (DE); Ina Ostermay, Berlin (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 196 days.

(21) Appl. No.: 13/238,180

(22) Filed: Sep. 21, 2011

(65) Prior Publication Data
US 2012/0153402 A1 Jun. 21, 2012

(30) Foreign Application Priority Data
Dec. 21, 2010 (DE) .......... 10 2010 063 772

(51) Int. Cl.
H01L 21/66 (2006.01)
H01L 21/8234 (2006.01)
H01L 21/8238 (2006.01)

(52) U.S. Cl.
CPC H01L 21/823412 (2013.01); H01L 21/823418 (2013.01); H01L 21/823807 (2013.01); H01L 21/823814 (2013.01); H01L 22/12 (2013.01)
USPC ........................................... 438/300; 438/14

(58) Field of Classification Search
CPC .............. H01L 21/823412; H01L 21/823418; H01L 21/823807; H01L 21/823814; H01L 22/12
USPC .................................................. 438/300, 14
See application file for complete search history.

(56) References Cited

U.S. PATENT DOCUMENTS

| | | | | |
|---|---|---|---|---|
| 7,381,622 B2 * | 6/2008 | Hellmich et al. | ............ | 438/300 |
| 7,579,262 B2 | 8/2009 | Hoentschel et al. | .......... | 438/478 |
| 7,682,915 B2 * | 3/2010 | Chen et al. | .................... | 438/300 |
| 8,232,172 B2 * | 7/2012 | Adam et al. | .................. | 438/300 |
| 8,236,659 B2 * | 8/2012 | Tsai et al. | ..................... | 438/300 |
| 8,247,284 B2 * | 8/2012 | Tamura | ......................... | 438/199 |
| 8,269,255 B2 * | 9/2012 | Shin et al. | ..................... | 257/190 |
| 8,278,164 B2 * | 10/2012 | Li et al. | ......................... | 438/197 |
| 8,283,233 B2 * | 10/2012 | Balasubramanian | ......... | 438/289 |
| 8,324,059 B2 * | 12/2012 | Guo et al. | ...................... | 438/300 |
| 8,329,547 B2 * | 12/2012 | Wu et al. | ....................... | 438/300 |
| 8,377,784 B2 * | 2/2013 | Cheng et al. | ................... | 438/300 |
| 8,377,785 B2 * | 2/2013 | Dyer | ............................. | 438/300 |

(Continued)

FOREIGN PATENT DOCUMENTS

DE 102006015090 A1 10/2007 .......... H01L 21/8234
DE 102009010847 A1 9/2010 .......... H01L 21/8238

OTHER PUBLICATIONS

Translation of Official Communication from German Patent Office for German Patent Application No. 10 2010 063 772.6 dated Sep. 1, 2011.

Primary Examiner — Mary Wilczewski
(74) Attorney, Agent, or Firm — Amerson Law Firm, PLLC

(57) ABSTRACT

When forming sophisticated transistors requiring an embedded semiconductor alloy, the cavities may be formed with superior uniformity on the basis of, for instance, crystallographically anisotropic etch steps by providing a uniform oxide layer in order to reduce process related fluctuations or queue time variations. The uniform oxide layer may be formed on the basis of an APC control regime.

17 Claims, 5 Drawing Sheets

(56) References Cited

U.S. PATENT DOCUMENTS

| | | | |
|---|---|---|---|
| 8,383,485 B2* | 2/2013 | Wang | 438/300 |
| 8,404,538 B2* | 3/2013 | Lai et al. | 438/229 |
| 8,426,284 B2* | 4/2013 | Yeh et al. | 438/300 |
| 8,431,460 B2* | 4/2013 | Huang et al. | 438/301 |
| 8,450,166 B2* | 5/2013 | Zhang et al. | 438/198 |
| 8,450,167 B2* | 5/2013 | He et al. | 438/198 |
| 8,455,317 B2* | 6/2013 | Shin et al. | 438/269 |
| 8,455,324 B2* | 6/2013 | Fukuda et al. | 438/300 |
| 8,455,325 B2* | 6/2013 | Fukuda et al. | 438/300 |
| 8,486,794 B1* | 7/2013 | Chou | 438/300 |
| 8,518,786 B2* | 8/2013 | Wang | 438/300 |
| 8,524,566 B2* | 9/2013 | Flachowsky et al. | 438/300 |
| 8,530,316 B2* | 9/2013 | Cheng et al. | 438/300 |
| 2005/0148147 A1* | 7/2005 | Keating et al. | 438/299 |
| 2006/0084235 A1* | 4/2006 | Barr et al. | 438/300 |
| 2007/0196987 A1* | 8/2007 | Chidambarrao et al. | 438/285 |
| 2007/0232006 A1* | 10/2007 | Hellmich et al. | 438/300 |
| 2008/0237742 A1* | 10/2008 | Ranade et al. | 257/401 |
| 2008/0283906 A1* | 11/2008 | Bohr | 257/327 |
| 2009/0101942 A1* | 4/2009 | Dyer | 257/288 |
| 2010/0210083 A1 | 8/2010 | Fukuda et al. | 438/285 |
| 2010/0219475 A1 | 9/2010 | Kronholz et al. | 257/351 |
| 2010/0264469 A1 | 10/2010 | Zhu et al. | 257/288 |
| 2011/0042729 A1* | 2/2011 | Chen et al. | 257/288 |
| 2011/0042753 A1* | 2/2011 | Jain et al. | 257/369 |
| 2011/0049567 A1* | 3/2011 | Peng et al. | 257/190 |
| 2012/0049296 A1* | 3/2012 | Kronholz et al. | 257/410 |

* cited by examiner

EMBEDDED SIGMA-SHAPED SEMICONDUCTOR ALLOYS FORMED IN TRANSISTORS BY APPLYING A UNIFORM OXIDE LAYER PRIOR TO CAVITY ETCHING

BACKGROUND OF THE INVENTION

1. Field of the Invention

Generally, the present disclosure relates to the fabrication of integrated circuits, and, more particularly, to transistors comprising sigma-shaped embedded semiconductor materials, such as embedded semiconductor alloys, so as to enhance charge carrier mobility in the channel regions of the transistors.

2. Description of the Related Art

The fabrication of complex integrated circuits requires the provision of a large number of transistor elements, which represent the dominant circuit element for complex circuits. For example, several hundred millions of transistors may be provided in presently available complex integrated circuits. Generally, a plurality of process technologies are currently practiced, wherein, for complex circuitry, such as microprocessors, storage chips and the like, MOS technology is the most promising approach due to the superior characteristics in view of operating speed and/or power consumption and/or cost efficiency. In MOS circuits, field effect transistors, i.e., P-channel transistors and/or N-channel transistors, are used for forming circuit elements, such as inverters and other logic gates to design highly complex circuit assemblies, such as CPUs, storage chips and the like. During the fabrication of complex integrated circuits using MOS technology, transistors are formed on a substrate including a crystalline semiconductor layer. A MOS transistor or generally a field effect transistor, irrespective of whether an N-channel transistor or a P-channel transistor is considered, comprises so-called PN junctions that are formed by an interface of highly doped drain and source regions with an inversely or weakly doped channel region disposed between the drain region and the source region. The conductivity of the channel region, i.e., the drive current capability of the conductive channel, is controlled by a gate electrode formed in the vicinity of the channel region and separated therefrom by a thin insulating layer. The conductivity of the channel region, upon formation of a conductive channel due to the application of an appropriate control voltage to the gate electrode, depends on the dopant concentration, the mobility of the charge carriers and, for a given extension of the channel region in the transistor width direction, on the distance between the source and drain regions, which is also referred to as channel length. Thus, the reduction of the channel length, and associated therewith the reduction of the channel resistivity, is a dominant design criterion for accomplishing an increase in the operating speed of the integrated circuits.

The continuing shrinkage of the transistor dimensions, however, involves a plurality of issues associated therewith that have to be addressed so as to not unduly offset the advantages obtained by steadily decreasing the channel length of MOS transistors. For example, highly sophisticated dopant profiles, in the vertical direction as well as in the lateral direction, are required in the drain and source regions so as to provide low sheet and contact resistivity in combination with desired channel controllability. Moreover, the gate dielectric material may also be adapted to the reduced channel length in order to maintain the required channel controllability. However, some mechanisms for maintaining high channel controllability may also have a negative influence on the charge carrier mobility in the channel region of the transistor, thereby partially offsetting the advantages gained by the reduction of the channel length.

Since the continuous size reduction of the critical dimensions, i.e., the gate length of the transistors, necessitates the adaptation and possibly the new development of highly complex process techniques and may also contribute to less pronounced performance gain due to mobility degradation, it has been proposed to enhance the channel conductivity of the transistor elements by increasing the charge carrier mobility in the channel region for a given channel length, thereby enabling a performance improvement that is comparable with the advance to a technology standard requiring extremely scaled critical dimensions, while avoiding or at least postponing many of the process adaptations associated with device scaling.

One efficient mechanism for increasing the charge carrier mobility is the modification of the lattice structure in the channel region, for instance by creating tensile or compressive stress in the vicinity of the channel region so as to produce a corresponding strain in the channel region, which results in a modified mobility for electrons and holes, respectively. For example, creating tensile strain in the channel region for a standard crystallographic configuration of the active silicon material, i.e., a (100) surface orientation with the channel length aligned to the <110> direction, increases the mobility of electrons, which in turn may directly translate into a corresponding increase in conductivity. On the other hand, compressive strain in the channel region may increase the mobility of holes, thereby providing the potential for enhancing the performance of P-type transistors. The introduction of stress or strain engineering into integrated circuit fabrication is an extremely promising approach, since strained silicon may be considered as a new type of semiconductor material, which may enable the fabrication of fast powerful semiconductor devices without requiring expensive semiconductor materials, while many of the well-established manufacturing techniques may still be used.

Consequently, it has been proposed to introduce, for instance, a silicon/germanium material next to the channel region so as to induce a compressive stress that may result in a corresponding strain. When forming the silicon/germanium material, the drain and source regions of the PMOS transistors are selectively recessed to form cavities, while the NMOS transistors are masked, and subsequently the silicon/germanium material is selectively formed in the cavities of the PMOS transistor by epitaxial growth.

Generally, this approach results in a significantly improved transistor performance of P-channel transistors since drive current capability and switching speed are enhanced. Generally, the effect of the strain-inducing mechanism provided by the embedded silicon/germanium alloy strongly depends on the material composition of the silicon/germanium alloy, i.e., on the germanium concentration, since an increased amount of germanium in the alloy results in a greater lattice mismatch between the natural lattice constant of silicon/germanium and the lattice constant of the silicon base material. On the other hand, according to presently available selective deposition recipes for forming the silicon/germanium alloy, the germanium concentration may not be arbitrarily increased, since significant lattice defects may be created, thereby offsetting the advantages that should be obtained by providing the silicon/germanium alloy in a highly strained state. Consequently, in other approaches, the efficiency of the strain-inducing mechanism is increased for a given germanium concentration of the alloy by appropriately dimensioning the cavity that is formed laterally adjacent to the gate electrode structure, thereby increasing the amount of strained material that may finally act on the adjacent channel region. Moreover, the lateral offset or generally the proximity of the strained silicon/germanium alloy to the channel region may also significantly affect the finally achieved strain conditions in the channel region so that, in sophisticated approaches, it is attempted to continuously reduce the lateral offset of the cavities and thus of the silicon/germanium alloy from the channel region. To this end, appropriate etch techniques may be applied in combination with appropriate protective liner materials provided at sidewalls of the gate electrode structures in order to further reduce the lateral offset of the resulting cavities.

In still other developments with respect to enhancing performance of sophisticated semiconductor devices, the well-established gate materials silicon dioxide or silicon oxynitride and polysilicon are increasingly replaced by sophisticated material systems since typically a reduction of the gate length of field effect transistors may require a corresponding adaptation of the capacitive coupling of the gate electrode to the channel region, which has been conventionally achieved by further reducing the silicon dioxide-based gate dielectric material. With a thickness of less than 2 nm in sophisticated field effect transistors having a gate length of 50 nm and less, however, the leakage currents through the thin gate dielectric material may reach values that may no longer be compatible with the power consumption requirements and heat dissipation capabilities of many types of complex circuits. Therefore, the silicon dioxide-based gate dielectric materials are increasingly replaced by so-called high-k dielectric materials, which are to be understood as dielectric materials having a dielectric constant of 10.0 and higher. For example, a plurality of metal oxides and silicates, or combinations thereof, such as hafnium oxide and the like, may be used, possibly in combination with an extremely thin conventional dielectric material, in order to provide the high capacitive coupling, while restricting the resulting gate leakage currents to an acceptable level. Similarly, the polysilicon material may be replaced, at least at the vicinity of the sophisticated high-k dielectric material in order to enable an appropriate adaptation of the work function and thus threshold voltage, thereby also enhancing performance as, for instance, the formation of any depletion zone, as is typically the case in sophisticated polysilicon-based devices, may be avoided while also superior conductivity of a corresponding replacement material, such as titanium nitride, possibly in combination with work function adjusting metal species, may be achieved.

In sophisticated applications, frequently providing a superior gate electrode structure on the basis of a high-k dielectric material and the incorporation of a strain-inducing semiconductor alloy, such as silicon/germanium, are combined in order to further enhance overall performance of the transistors. Upon further device scaling, however, the efficiency of, in particular, the strain-inducing mechanism may be less pronounced or may even contribute to significant variations in transistor characteristics, which is caused by process variations upon forming corresponding cavities in close proximity to the sophisticated gate electrode structures and subsequently selectively growing the silicon/germanium alloy therein. It has been recognized that generally a superior encapsulation of the gate electrode materials and the gate dielectric material has to be ensured, in particular when sophisticated high-k metal gate electrode structures are formed, since the reactive process atmospheres which have to be established upon forming the cavities and growing the silicon/germanium alloy may result in a certain degree of material erosion, which in turn may result in corresponding variations of transistor characteristics, such as threshold voltage and the like. Thus, any protective materials, such as silicon nitride liners and the like, which may typically be provided on sidewalls of sophisticated gate electrode structures may not be reduced in thickness to an extent as would be desirable in view of increasing the efficiency of the strain-inducing effect of the embedded silicon/germanium alloy. That is, reducing the thickness of any protective sidewall spacer material, and thus reducing the lateral offset of the embedded silicon/germanium material, may unduly influence the overall transistor behavior so that pronounced variations during the transistor operation may be observed, thereby making the approach of reducing thickness of any protective sidewall spacers less than desirable.

Therefore, other approaches have been contemplated in which well-controllable etch strategies are applied, which may allow reducing the lateral offset while at the same time ensuring integrity of the sensitive gate materials. For example, it is well known that a plurality of wet chemical etch recipes may result in a crystallographically anisotropic etch behavior, in which a certain type of crystal planes may act as efficient etch stop planes which, when exposed during the etch process, may significantly slow down the advance of the material removal process, while, in other crystal corrections, the etch process may advance with the desired high etch rate. Depending on the basic crystallographic configuration of the semiconductor material, therefore, well-defined etch conditions may be achieved, which may have a self-limiting lateral etch behavior, for instance for a standard silicon configuration with a (100) crystal plane as a surface plane and a (110) axis oriented along the current flow direction in the corresponding channel regions. In this manner, the (111) crystal planes may act as etch stop planes. Although the approach of using crystallographically anisotropic etch techniques represents a promising approach for defining the dimensions and the shape of the cavities in a well-controllable manner, it turns out, however, that, upon further device scaling, a significant variation of the dimensions of the resulting cavities may be observed, as will be explained in more detail with reference to FIGS. 1a-1d.

FIG. 1a schematically illustrates a cross-sectional view of a semiconductor device 100 comprising a substrate 101 and a semiconductor layer 102, such as a silicon layer. The semiconductor layer 102 typically comprises a plurality of active regions, which are to be understood as semiconductor regions in and above which one or more transistors are to be formed. For convenience, a single active region 102A is illustrated in FIG. 1a. Furthermore, a gate electrode structure 160 is formed on the active region 102A and comprises a gate dielectric material 161, an electrode material 162, a dielectric cap layer or layer system 163 and a protective spacer or spacer structure 164. As discussed above, the gate electrode structure 160 may represent a sophisticated high-k metal gate electrode structure, wherein the gate dielectric material 161 may include a high-k dielectric material, while the electrode material 162 may comprise metal-containing electrode materials, work function metals and the like, in order to adjust the transistor characteristics. In other cases, sophisticated polysilicon/silicon dioxide-based electrode structures are provided, wherein also superior integrity, at least at the vicinity of the gate dielectric material 161, is to be ensured since typically, even for conventional dielectric materials, the extremely reduced thickness may require avoiding any undue exposure to any reactive process atmospheres during the further processing of the device 100. Consequently, a reliable confinement of the materials 161 and 162 is required and is accomplished by means of the dielectric cap layer 163 and the spacer 164, which may be comprised of any appropriate material, such as silicon nitride, silicon dioxide and the like. Furthermore, as discussed above, in sophisticated semiconductor devices, a length of the gate electrode structure 160, i.e., in FIG. 1a, the horizontal extension of the electrode material 162, may be 50 nm or even 40 nm and less.

The semiconductor device 100 as shown in FIG. 1a may be formed on the basis of complex process strategies including the formation of any isolation regions (not shown), followed by the formation of appropriate materials so as to provide a gate layer stack, which is subsequently patterned by using sophisticated lithography and etch techniques. In this manner, the layers 161, 162 and 163 may be formed with appropriate lateral dimensions in accordance with the design rules. Thereafter, the spacer or spacer structure 164 is formed, for instance, by depositing one or more material layers, such as silicon nitride materials and the like, and patterning these layers, at least above the active region 102A, in order to form the spacer structure 164. Thus, as indicated by the dashed lines, cavities 103 are to be formed in the active region 102A in order to form therein a strain-inducing silicon/germanium alloy. As discussed above, the cavities 103 may have a cross-sectional shape that may also be referred to as sigma shaped, since, at least at a side towards a channel region 152, inclined sidewall surface areas may border the cavities 103, wherein the sidewalls may substantially correspond to specific crystal planes, such as (111) planes for a silicon material.

FIG. 1b schematically illustrates the device 100 in a further advanced manufacturing stage. For example, in some approaches, a recess 103R is formed in the active region 102A in order to provide a certain degree of under-etching of the cavity 103 during a subsequent crystallographically anisotropic etch process. Thus, by adjusting the depth of the recess 103R, generally the size and shape of the cavity 103 during the subsequent etching can be determined. To this end, well-established plasma-based etch recipes may be applied so as to etch silicon material selectively with respect to, for instance, silicon dioxide, silicon nitride and the like.

After the etch process for forming the recess 103R, however, the device 100 may have to be exposed to various process atmospheres, such as the ambient atmosphere and the like, wherein exposure time may significantly vary since typically the scheduling of the manufacturing flow in a complex semiconductor facility may be rather complex so that, for various types of products, or even for the same time of product, and different substrates, differing queue times associated with the various processes may be encountered. Consequently, usually an oxide layer 104 may form on exposed surface areas 103S of the recess 103R after the plasma-based etch process for forming the recess 103R and any further processes required for forming the cavity 103 in its final desired shape.

FIG. 1c schematically illustrates a cross-sectional view of a typical sequence of etch processes, which are applied so as to form the cavities 103 in their desired sigma-shaped configuration. As shown, in a first etch process 105, the oxide layer 104 (FIG. 1b) is removed on the basis of appropriate etch chemistries, such as hydrofluoric acid, in order to prepare the device 100 for a subsequent crystallographically anisotropic etch process 106. To this end, any appropriate etch chemistry, such as TMAH (tetra methyl ammonium hydroxide) or any other hydroxide chemistries may be applied, wherein many of these chemistries may have a high selectivity with respect to silicon dioxide, silicon nitride and the like. Generally, the high selectivity during a corresponding crystallographically anisotropic etch process 106 is desirable, for instance in view of gate integrity and the like. On the other hand, any oxide residues which may not be entirely removed during the etch process 105 may result in a significant reduced etch rate during the etch process 106. In the example shown in FIG. 1c, it may be assumed that the device 100 receives the cavity 103 so as to substantially correspond to the target size that a depth 103D and a lateral extension below the gate electrode structure 160, indicated by 103L, may be within a valid range.

FIG. 1d schematically illustrates the situation during the etch sequence 105, 106 for a semiconductor device 100A, which may be a device formed on the same substrate as the device 100, however at a very different position, or the device 100A may represent a device formed on a different substrate having experienced a different queue time prior to performing the etch process 105. As shown, upon using predetermined process parameters of the process 105, a thin oxide layer 104 may still be formed on the surface areas of the recess 103R which, however, may have a significant influence during the subsequent crystallographically anisotropic etch process 106. That is, due to the high selectivity of the etch chemistry used for different process parameters during a very long initial phase of the process 106, the oxide layer 104 has to be removed so that, during the resulting etch time, the cavity 103 is provided with reduced size, as indicated by the reduced depth 103D and/or the reduced lateral extension 103L.

Consequently, due to any process non-uniformities occurring across individual substrates and also across a plurality of substrates caused by scheduling non-uniformities and process related non-uniformities, the further processing of different semiconductor devices is continued on the basis of the cavities 103 having different size, which may thus result in significantly different transistor characteristics, as is also described above. Consequently, although the approach of using the crystallographically anisotropic etch process 106 is in principle very promising, it turns out, however, that nevertheless a pronounced variability of transistor characteristics is observed.

In view of the situation described above, the present disclosure relates to manufacturing techniques and semiconductor devices in which an embedded semiconductor material may be formed in active regions of transistors, avoiding or at least reducing the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

The present disclosure generally provides semiconductor devices and manufacturing techniques in which an embedded semiconductor material may be formed in active regions of transistors with superior uniformity by forming a uniform oxide layer in exposed surface areas of the active regions under consideration prior to performing a process sequence for preparing exposed surface areas for a subsequent well-controllable etch process, such as a crystallographically anisotropic etch process, in order to determine the final size and shape of the corresponding cavities. In some illustrative embodiments disclosed herein, the uniform oxide layer may be formed on the basis of a controlled oxidation process in which the initial oxide thickness and/or the final oxide thickness may be determined and may be used as a control parameter.

One illustrative method disclosed herein comprises forming an oxide layer on exposed surface areas of an active region based on a predefined target thickness of the oxide layer, wherein the active region has formed thereon a gate electrode structure. The method further comprises performing a sequence of wet chemical etch processes so as to remove the oxide layer and form a cavity in the active region. Additionally, the method comprises forming a semiconductor material in the cavity and forming drain and source regions in the active region.

A further illustrative method disclosed herein relates to forming an embedded semi-conductor alloy in a transistor. The method comprises determining at least one of an initial thickness and a final thickness of an oxide layer that is formed on exposed surface areas of an active region. Moreover, the method comprises performing an oxidation process by controlling at least one process parameter on the basis of the determined initial thickness and/or the determined final thickness and on the basis of a target final thickness of the oxide layer. The method further comprises forming a cavity in the active region by removing the oxide layer and performing a wet chemical etch process. Furthermore, the semiconductor alloy is epitaxially grown in the cavity.

One illustrative semiconductor device disclosed herein comprises a plurality of transistors, each of which differs from any of the other transistors of the plurality of transistors by at least one transistor-specific characteristic. Moreover, each of the plurality of transistors comprises a gate electrode structure formed above a crystalline semiconductor region that comprises a sigma-shaped semiconductor alloy. The size of the sigma-shaped semiconductor alloy varies by less than 10 percent across the plurality of transistors relative to an averaged size of the sigma-shaped semiconductor alloys of the plurality of transistors.

BRIEF DESCRIPTION OF THE DRAWINGS

The disclosure may be understood by reference to the following description taken in conjunction with the accompanying drawings, in which like reference numerals identify like elements, and in which.

Figure 1A:
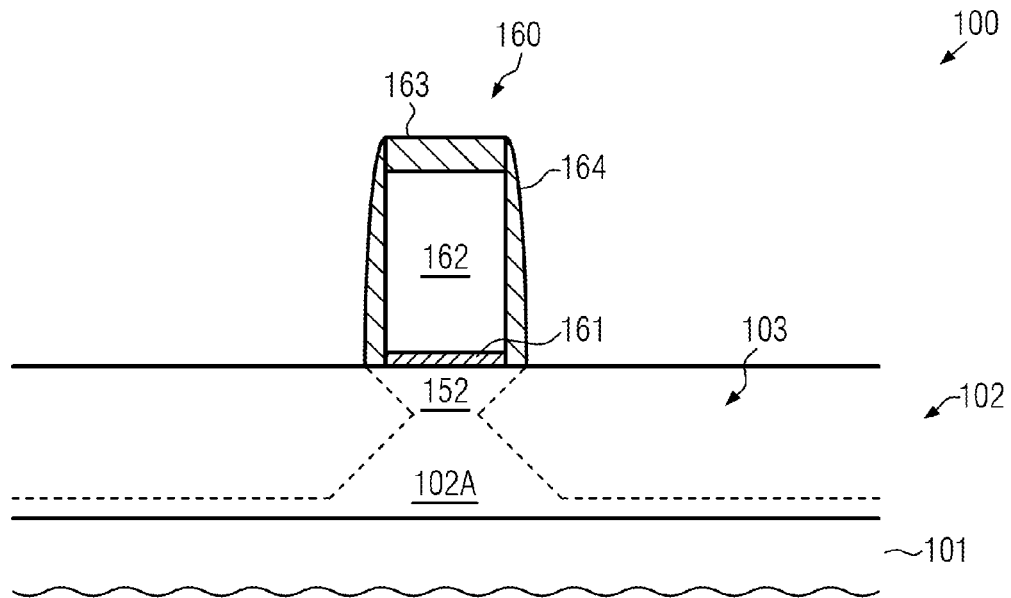
FIGS. 1a-1d schematically illustrate cross-sectional views of a semiconductor device during various manufacturing stages in forming a sigma-shaped cavity in the active regions of transistors on the basis of conventional process strategies.
Figure 1B:
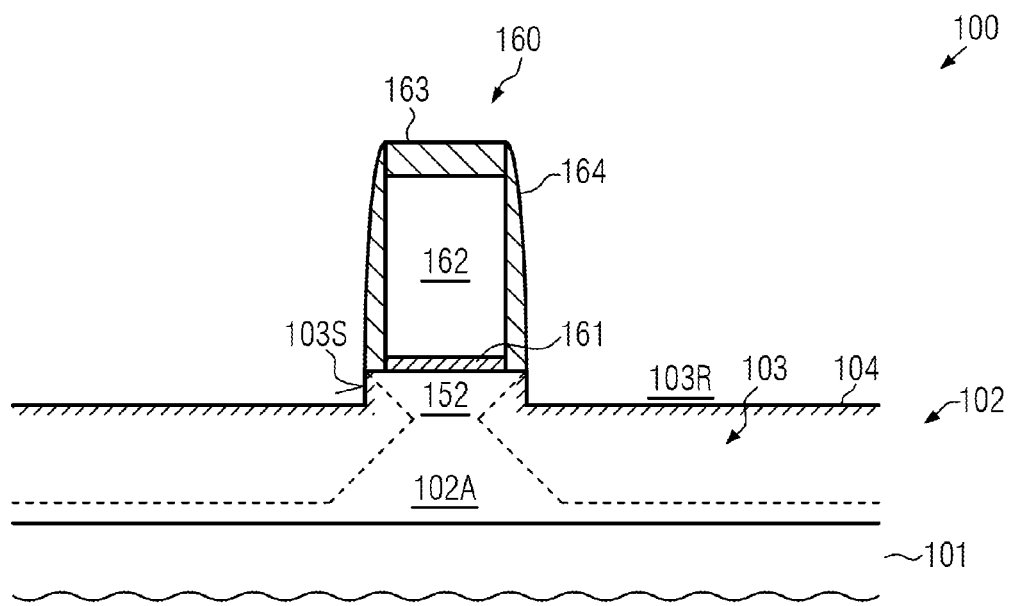
Figure 1C:
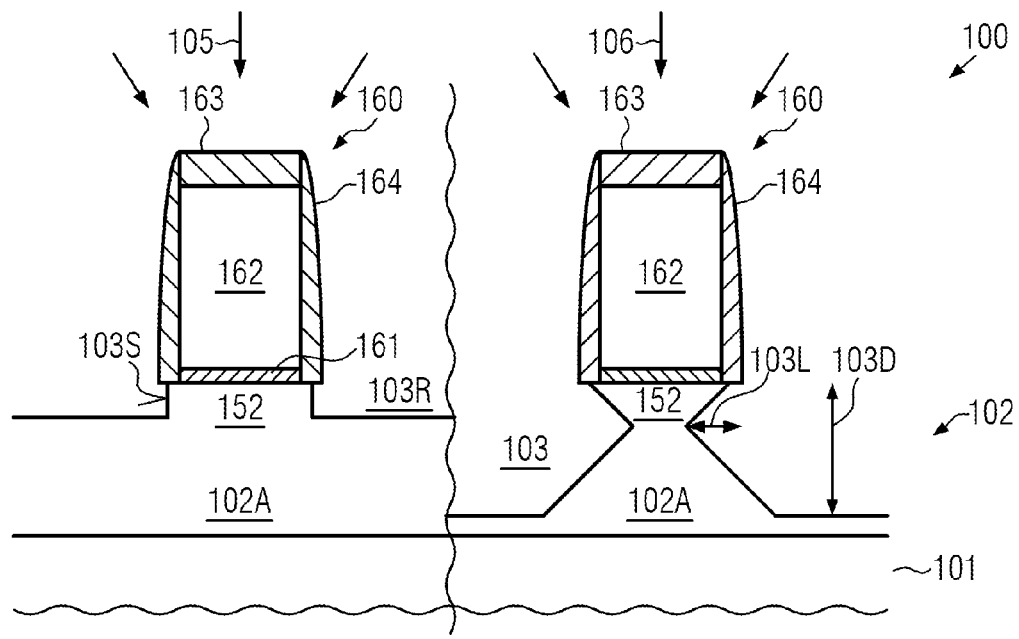
Figure 1D:
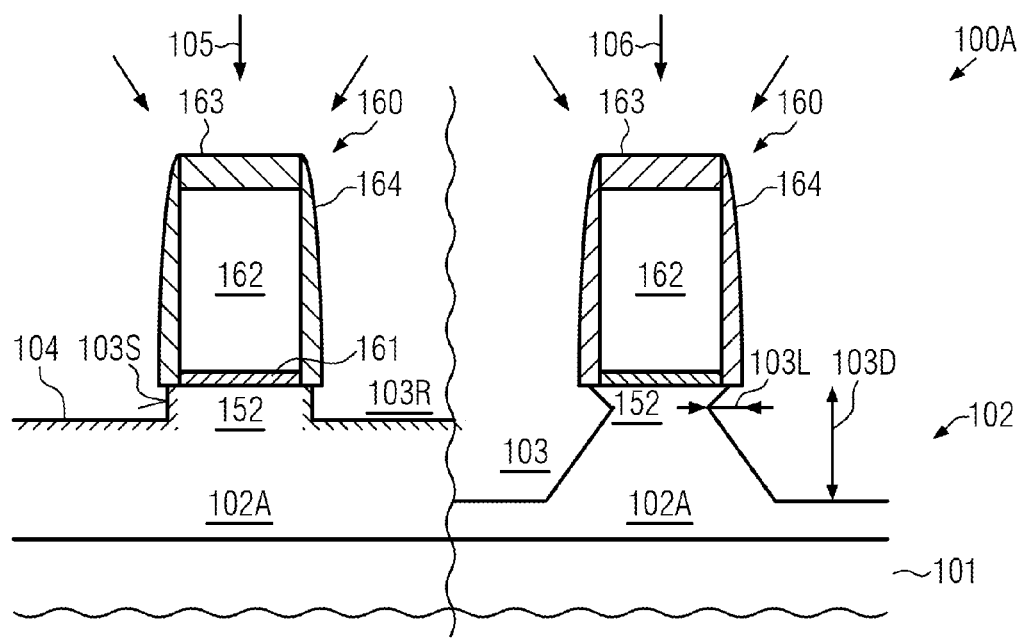

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the present invention contemplates manufacturing techniques and semiconductor devices in which superior uniformity may be achieved upon forming embedded semiconductor alloys in a plurality of different transistors, which may require the incorporation of a semiconductor alloy, such as a strain-inducing semiconductor alloy, a semiconductor alloy for adjusting the overall transistor characteristics and the like, wherein the semiconductor alloy is to be provided with a high degree of similarity in any of the transistors, irrespective of any differences in configuration and/or local environment of the transistors and/or transistor characteristics, such as threshold voltage and the like, while also a high degree of uniformity is to be achieved across a plurality of different semiconductor products. To this end, it has been recognized that a superior degree of uniformity may be achieved during the entire process flow by incorporating a very uniform oxide layer after exposing any surface areas of the active regions, which are to receive the embedded semiconductor material. In this manner, these surface areas may be passivated in a highly controllable manner and may thus be relatively insensitive for any further variations, for instance with respect to any processes which may exhibit a certain degree of dependency on pattern density, different queue times and the like. For example, upon forming an oxide layer of well-defined thickness at any appropriate manufacturing stage, the influence of various process atmospheres may be significantly reduced, thereby reducing the sensitivity with respect to queue time variations. Moreover, the oxide layer may be formed in some illustrative embodiments by a wet chemical oxidation process, which may be less sensitive with respect to the local neighborhood of the various active regions under consideration, thereby resulting in a moderately high degree of uniformity, irrespective of the specific location within a single substrate, which may thus also contribute to a more robust overall process flow.

It should be appreciated that the principles disclosed herein may be applied in the context of semiconductor devices comprising gate electrode structures having a gate length of 50 nm and less, or even 40 nm and less, since here any non-uniformities upon incorporating a semiconductor material into active regions may have a very pronounced effect on the finally obtained transistor characteristics. The gate electrode structures may be provided on the basis of a conventional configuration, while, in other illustrative embodiments, sophisticated high-k metal gate electrode structures may be provided on the active regions prior to forming the cavities having the desired size and shape. In some illustrative embodiments, the cavities may be formed on the basis of at least one crystallographically anisotropic etch process, for instance by using TMAH as an efficient etch chemistry. In other cases, in addition to the wet chemical etch process, a preceding recessing of the active regions may be implemented in order to more flexibly control the desired final shape and size of the cavities.

With reference to FIGS. 2a-2d, further illustrative embodiments will now be described in more detail, wherein reference may also be made to FIGS. 1a-1d, if required.

Figure 2A:
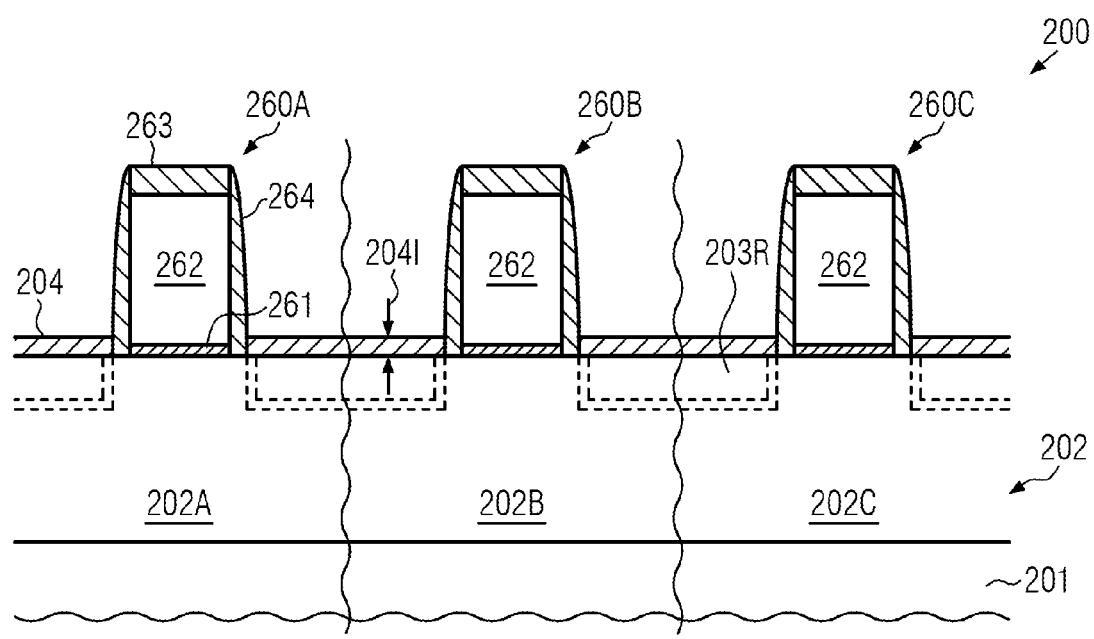
FIG. 2a schematically illustrates a cross-sectional view of a semiconductor device in a manufacturing stage in which embedded semiconductor alloys are to be formed in the active regions of a plurality of different transistors, according to illustrative embodiments.

FIG. 2a schematically illustrates a cross-sectional view of a semiconductor device 200 in a manufacturing stage in which a plurality of active regions 202A, 202B, 202C are provided in a semiconductor layer 202, such as a silicon layer, which in turn is formed above a substrate 201. The layer 202 and the substrate 201 may, in some cases, represent a silicon-on-insulator (SOI) configuration when a buried insulating material (not shown) may be directly formed below the semiconductor layer 202. In other cases, as shown in FIG. 2a, the layer 202 and the substrate 201 may represent a bulk architecture in which the layer 202 may directly connect to a crystalline semiconductor material of the substrate 201. Furthermore, the active regions 202A, 202B, 202C may have incorporated therein any basic dopant concentration as is required for adjusting the overall transistor characteristics. It should be appreciated that the active regions 202A, 202B, 202C may differ from each other or may have substantially the same configuration, wherein, however, any of these active regions may receive cavities that have to be provided with a very similar size and shape, that is, with a very similar depth and lateral degree of under-etching of respective gate electrode structures 260A, 260B, 260C. It should be appreciated, however, that the semiconductor alloy to be formed in the corresponding cavities may also differ for the various active regions 202A, 202B, 202C, if considered appropriate.

The gate electrode structures 260A, 260B, 260C may have any appropriate configuration and may comprise a gate dielectric material 261, an electrode material 262, a dielectric cap layer 263 and a spacer structure 264. With respect to a specific configuration of the structures 260A, 260B, 260C, it may also be referred to the semiconductor device 100, as previously discussed. Moreover, in some illustrative embodiments, in this manufacturing stage, a recess 203R may be formed in the active regions 202A, 202B, 202C in order to adjust the size and shape of cavities still to be formed, as is also previously explained.

With respect to any process techniques for forming the device 200 as shown in FIG. 2a, the same criteria may apply as previously explained. Consequently, upon exposing the active regions 202A, 202B, 202C, for instance after forming the recesses 203R, if required, more or less pronounced oxidation may occur and may thus form an initial oxide layer 204, the thickness 204I of which may depend on process fluctuations, the time of exposure to ambient atmosphere and the like.

In order to reduce the influence of the presence of the layer 204 for the further processing and also to reduce the influence of any further processes to be performed prior to actually etching the cavities, the oxide layer 204 may be converted into an oxide layer of superior uniformity.

Figure 2B:
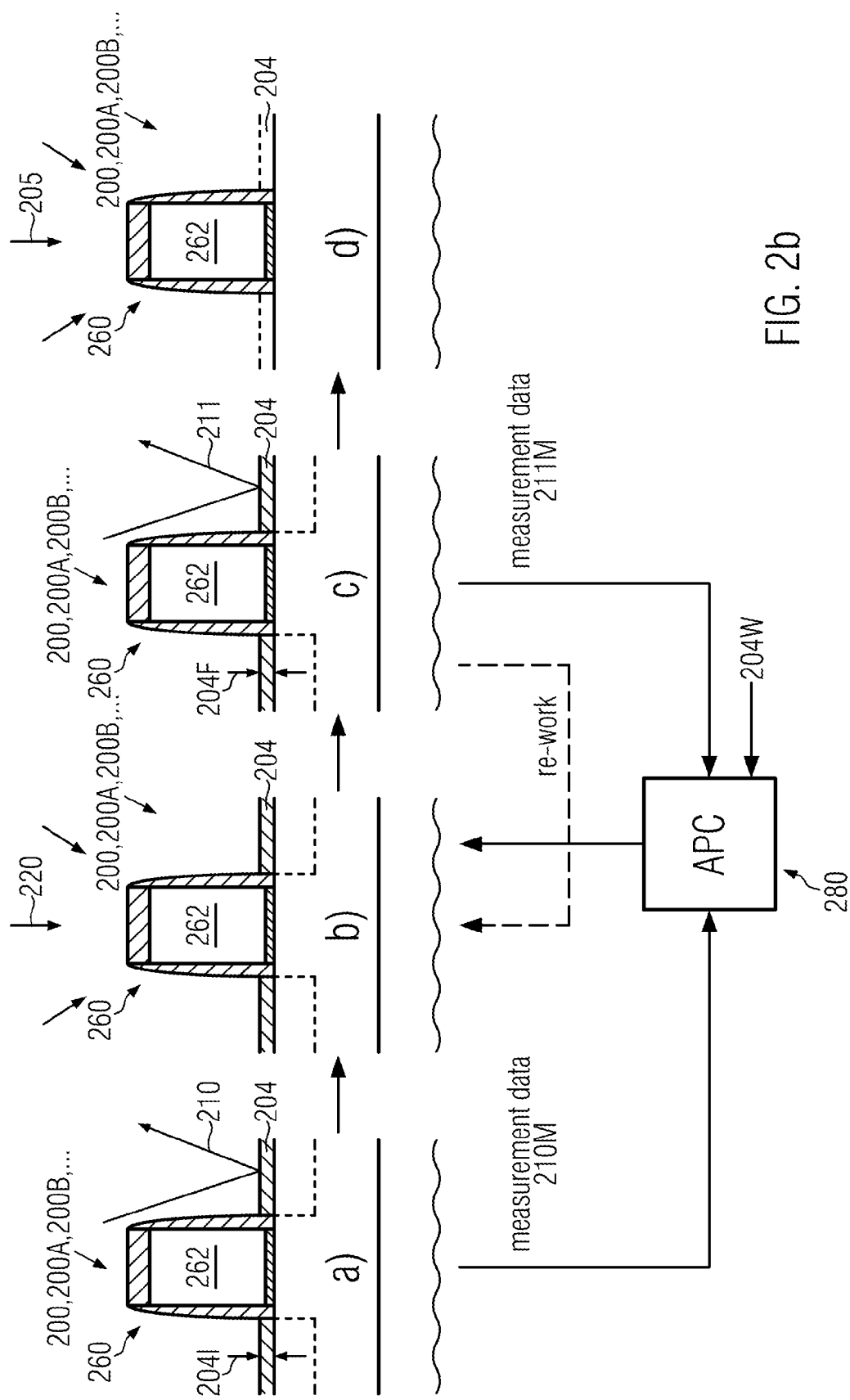
FIG. 2b schematically illustrates process flow and control regimes for providing a uniform oxide layer on exposed surface areas prior to performing a wet chemical etch process for defining the final shape and size of cavities in the active regions, according to illustrative embodiments.

FIG. 2b schematically illustrates a process flow for appropriately adjusting the thickness of the oxide layer 204 so as to provide superior uniformity during the further processing. In a first step, indicated as a), the device 200 and any other semiconductor devices having substantially the same configuration, as indicated by 200A, 200B, . . . , a representative determination of a thickness 204I of the layer 204 may be obtained. To this end, any appropriate measurement process 210 may be performed so as to obtain measurement data 210M, which may thus represent the thickness values of the various devices 200, 200A, 200B, . . . . The measurement process 210 may be performed on the basis of well-established optical inspection techniques, scatterometer techniques and the like, in which optical measurement data may be obtained. In other cases, other efficient measurement techniques may be applied, which may be sensitive to specifics of the layer 204, for instance its oxygen contents and the like, in order to obtain a measure that is indicative of the initial thickness 204I. For example, infrared spectroscopy techniques, such as Fourier transformed infrared spectroscopy (FTIR), may be used since these techniques are very sensitive to chemical bonds and may thus be able to determine the amount of silicon dioxide material based on the corresponding silicon and oxygen bondings and the like. Consequently, in some illustrative embodiments, the measurement data 210M may be provided to a process control system 280, which may be accomplished to control a subsequent process for modifying the oxide layer 204. In other illustrative embodiments, the measurement process 210 may be omitted and the devices 200, 200A, 200B . . . may directly pass on to a second step b), in which an oxidation process 220 may be applied in order to form the oxide layer 204 with superior uniformity. In some illustrative embodiments, the oxidation process 220 may be performed as a wet chemical oxidation process, for instance on the basis of APM/SPM (ammonium hydroxide/hydrogen peroxide mixture; sulfuric acid/hydrogen peroxide mixture), wherein the control system 280 may provide an appropriate target value for a manipulated variable, such as the overall process time of the process 220 for otherwise given process parameters in order to adjust a thickness of the layer 204. In some illustrative embodiments, when the measurement data 210M are available from step a), the control system 280, which may be provided in the form of an APC (advanced process control) system, the manipulated process parameter may be determined on the basis of the measurement data 210M, which may be achieved by implementing an appropriate model of the oxidation process 220 in the system 280 and determining an updated value of the manipulated variable, such as the process time based on the information of the devices previously subjected to the measurement process 210 of step a). In other cases, the system 280 may be operated on the basis of measurement data obtained from the layer 204 in a step c) when performing a further measurement process 211 in order to obtain measurement data 211M. Thus, during the measurement process 211, the final thickness 204F may be determined in order to compare the value 204F with a predetermined target value 204W, which may be applied to the system 280 or which may be stored therein. Consequently, based on the measurement data 211M, it may be decided whether corresponding devices are appropriate for further processing, for instance when the measurement data 211M indicate that the final thickness 204F is within a valid range centered around the target value 204W, while, in other cases, respective devices that fail to comply with this criterion may be indicated for being reworked and any such devices may be reworked in step b) by further oxidizing the corresponding layer. In this case, the measurement data 211M may be used as corresponding feed forward data for the control system 280 if this system is configured to operate on the basis of feed forward measurement data, such as the measurement data 210M.

It should be appreciated that providing a feed forward control loop, for instance by providing pre-oxidation measurement data, such as the measurement data 210M, and measurement data 211M of devices that are without the valid thickness range may enable a very efficient adaptation of the oxidation process 220. In other cases, the treatment in step b) may result in two thick oxidation layers, in particular when reworking any substrates. In other cases, a feed forward loop is not implemented in the system 280. Generally, the control system 280 may operate such that any reworked substrates may generally be processed on the basis of a reduced process time compared to non-reworked substrates, thereby reducing the probability of obtaining an oxide layer that is too thick.

In other illustrative embodiments, the APC system 280 operates as a feed forward system using the measurement data 210M and any measurement data 211M of substrates to be reworked, while the actual control activity is based on the feed forward measurement data, while the measurement data 211M may not influence the determination of the manipulated variable.

Any substrates which have passed step c) may then be subjected to further processing, which may finally result in a step d), in which the previously formed oxide layer 204 may be removed on the basis of appropriately adapted process parameters in order to reliably remove the layer 204, however, without unduly affecting other device areas, such as isolation regions and the like. That is, after passing step c), the devices 200, 200A, 200B, . . . are efficiently passivated with respect to any further processes and queue time variations since the layer 204 may not significantly change during the further processing. After a certain time interval, the devices may then be scheduled for the actual formation of the cavity, wherein the etch process 205 may represent one of the two or more etch steps, which may be performed within a narrow time window in order to avoid undue process variations. Since the layer 204 may have a substantially uniform layer thickness for any type of device entering step d), the process 205 may be performed on the basis of relatively tightly set process parameters, thereby not unduly increasing any material erosion in other sensitive device areas, such as isolation regions, which may contribute to pronounced surface topography that would result in further device non-uniformities.

Figure 2C:
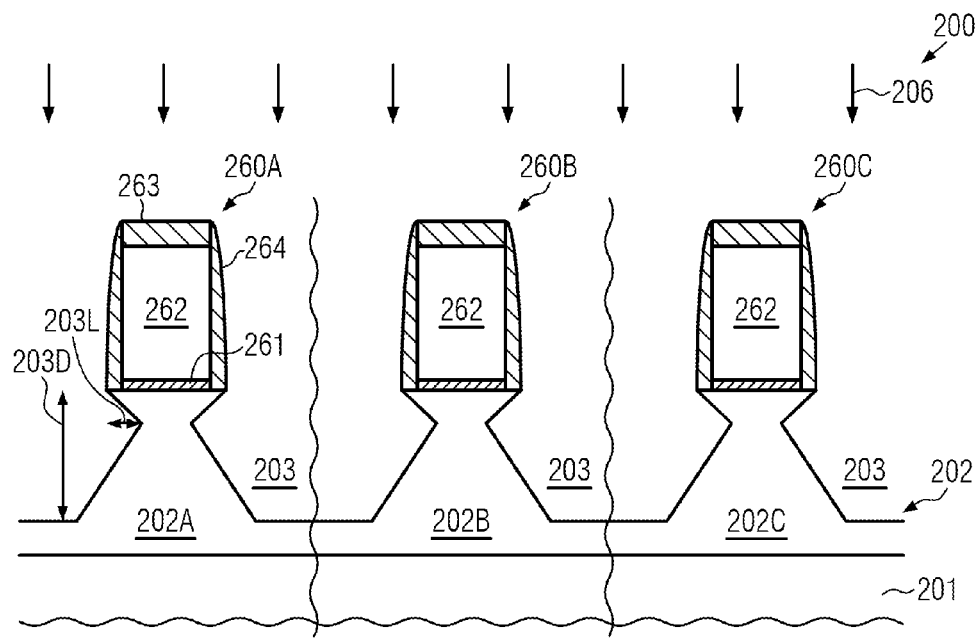
FIGS. 2c-2d schematically illustrate cross-sectional views of the semiconductor device in a further advanced manufacturing stage, according to further illustrative embodiments.

FIG. 2c schematically illustrates the semiconductor device 200 when subjected to a wet chemical etch process 206 that is designed to form the cavities 203 with the desired size and shape. As discussed above, the etch processes 205 (FIG. 2b) and 206 may be performed within a time interval that is less compared to a time interval between step c) and step d) of FIG. 2b, thereby providing sufficient flexibility in scheduling a complex manufacturing process in a complex semiconductor facility. Consequently, since any oxide material may be reliably removed prior to the etch process 206, the resulting cavities 203 may have a similar configuration, for instance a similar depth 203D and a similar lateral extension 203L, wherein a variation may be less than approximately 10% for the plurality of active regions 202A, 202B, 202C. For example, any appropriate dimension, such as the depth 203D and/or the lateral extension 203L, may be determined for any of these active regions and may be used to determine an average dimension or size, and thus a variation of any of the cavities 203 with respect to the average size or dimension may be less than approximately 10%. Consequently, the further processing may be continued by forming a semiconductor alloy in the cavities 203, which may thus also have similar dimensions in any of the active regions 202A, 202B, 202C due to the superior uniformity of the cavities 203.

Figure 2D:
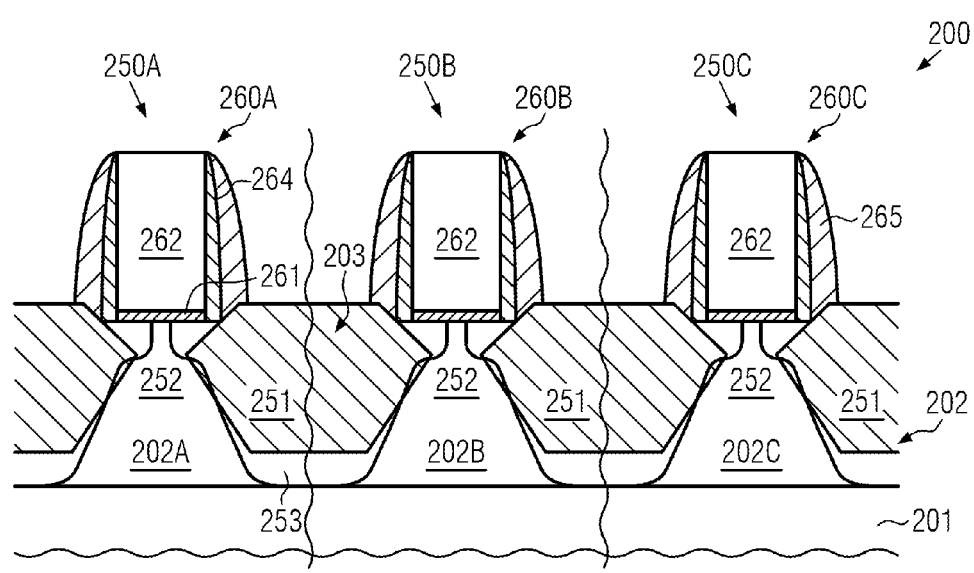

FIG. 2d schematically illustrates the semiconductor device 200 in a further advanced manufacturing stage. As shown, a semiconductor alloy 251 may be formed in the cavities 203 and may thus provide similar strain conditions or any other electronic conditions in any of the active regions 202A, 202B and 202C. Consequently, the characteristics of transistors 250A, 250B, 250C may be controlled by design criteria without being restricted by process related fluctuations, which may be caused in conventional strategies by a variation of the corresponding cavities, as is previously described with reference to the device 100, 100A. Consequently, the semiconductor alloys 251 may have a very similar configuration for any of the transistors 250A, 250B, 250C although these transistors may differ from each other by at least one characteristic, such as the local neighborhood, for instance in terms of density of transistors, transistor threshold voltage, transistor width and the like. Furthermore, in the manufacturing stage shown, the transistors 250A, 250B, 250C may comprise a further spacer structure 265 formed on the gate electrode structures 260A, 260B, 260C so as to define the lateral and vertical dopant profile of drain and source regions 253. It should be appreciated that the transistors 250A, 250B, 250C may be formed on the basis of any appropriate process strategy. For example, the semiconductor alloys 251 may be formed on the basis of well-established selective epitaxial growth techniques in order to form any appropriate semiconductor alloy, such as a silicon/germanium alloy, or generally a compressive strain-inducing semiconductor alloy, while in other cases a silicon/carbon alloy may be provided. In this manner, the desired strain conditions in the channel region 252 may be achieved with superior uniformity across the plurality of transistors 250A, 250B, 250C. In other cases, the material 251 may comprise, in addition or alternatively to a strain-inducing alloy, any other semiconductor material in order to adjust the overall electronic characteristics. In particular, dopant species may be incorporated into the materials 251 during the deposition in order to establish a desired dopant profile, wherein the high degree of uniformity of the cavities 203 may enable a graded dopant profile upon growing the materials 251 with high uniformity across the plurality of different transistor types. Thereafter, the spacer structure 265 may be formed, possibly in combination with the incorporation of any dopant species by ion implantation, wherein at any appropriate manufacturing stage the dielectric cap layers 263 (FIG. 2c) may be removed.

After any high temperature processes, if required, the further processing may be continued by depositing a dielectric material above the transistors 250A, 250B, 250C and forming contact elements so as to connect to a metallization system (not shown).

As a result, the present disclosure provides semiconductor devices and manufacturing techniques in which superior uniformity of cavities may be achieved by providing a passivating oxide layer with superior uniformity, for instance shortly after forming corresponding recesses so as to reduce or eliminate the influence of any further processes that have to be performed prior to actually forming the cavities. Moreover, in this manner, any queue variations may also be reduced or completely eliminated.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method of forming an embedded semiconductor alloy in a transistor, the method comprising:
   determining an initial thickness of an initial oxide layer positioned on a surface of an active region of a semiconductor substrate;
   performing an oxidation process to add additional oxide material on said initial oxide layer so as to thereby define a final oxide layer having a final thickness;
   forming a cavity in said active region by removing said final oxide layer and performing a wet chemical etch process; and
   epitaxially growing said semiconductor alloy in said cavity.

2. The method of claim 1, wherein performing said oxidation process comprises controlling at least one parameter of said oxidation process based upon said determined initial thickness of said oxide layer.

3. The method of claim 2, wherein performing said oxidation process further comprises controlling at least one parameter of said oxidation process based upon a target final thickness for said final oxide layer.

4. The method of claim 1, wherein said wet chemical etch process has a crystallographically anisotropic etch behavior.

5. The method of claim 4, further comprising forming a recess in said active region prior to performing said oxidation process.

6. The method of claim 1, further comprising forming a gate electrode structure on said active region prior to performing said oxidation process.

7. The method of claim 1, wherein said semiconductor alloy is formed so as to induce a strain in a channel region of said active region.

8. The method of claim 1, wherein a time interval between removing said final oxide layer and performing said wet chemical etch process is less than a time interval between performing said oxidation process and removing said final oxide layer.

9. The method of claim 1, wherein said final oxide layer is a combination of said initial oxide layer and said additional oxide material added during said oxidation process.

10. A method of forming an embedded semiconductor alloy in a transistor, the method comprising:
    determining an initial thickness of an initial oxide layer positioned on a surface of an active region of a semiconductor substrate;
    determining a target thickness for additional oxide material to be formed on said initial oxide layer based upon at least said determined initial thickness of said initial oxide layer;
    performing an oxidation process to form said additional oxide material to said target thickness on said initial oxide layer so as to thereby define a final oxide layer having a final thickness, wherein said final oxide layer is a combination of said initial oxide layer and said additional oxide material added during said oxidation process;
    forming a cavity in said active region by removing said final oxide layer and performing a wet chemical etch process; and
    epitaxially growing said semiconductor alloy in said cavity.

11. The method of claim 10, wherein performing said oxidation process comprises controlling at least one parameter of said oxidation process based upon at least one of said determined initial thickness of said initial oxide layer and said target thickness of said additional oxide material.

12. The method of claim 11, wherein performing said oxidation process further comprises controlling at least one parameter of said oxidation process based upon a target final thickness for said final oxide layer.

13. The method of claim 10, wherein said wet chemical etch process has a crystallographically anisotropic etch behavior.

14. The method of claim 13, further comprising forming a recess in said active region prior to performing said oxidation process.

15. The method of claim 10, further comprising forming a gate electrode structure on said active region prior to performing said oxidation process.

16. The method of claim 10, wherein said semiconductor alloy is formed so as to induce a strain in a channel region of said active region.

17. The method of claim 10, wherein a time interval between removing said final oxide layer and performing said wet chemical etch process is less than a time interval between performing said oxidation process and removing said final oxide layer.

* * * * *

UNITED STATES PATENT AND TRADEMARK OFFICE
CERTIFICATE OF CORRECTION

PATENT NO. : 8,728,896 B2
APPLICATION NO. : 13/238180
DATED : May 20, 2014
INVENTOR(S) : Kronholz et al.

It is certified that error appears in the above-identified patent and that said Letters Patent is hereby corrected as shown below:

In the Claims

In claim 2, at column 13, line 37, before "oxide layer", insert -- initial --.

Signed and Sealed this
Fifteenth Day of July, 2014

Michelle K. Lee
*Deputy Director of the United States Patent and Trademark Office*